United States Patent [19]

Maki et al.

[11] Patent Number: 4,906,868
[45] Date of Patent: Mar. 6, 1990

[54] LOGIC CIRCUIT USING BIPOLAR COMPLEMENTARY METAL OXIDE SEMICONDUCTOR GATE AND SEMICONDUCTOR MEMORY DEVICE HAVING THE LOGIC CIRCUIT

[75] Inventors: Yasuhiko Maki, Kanagawa; Osamu Nomura, Kasugai, both of Japan

[73] Assignees: Fujitsu Limited, Kawasaki; Fujitsu VLSI Limited, Kasugai, both of Japan

[21] Appl. No.: 269,413

[22] Filed: Nov. 10, 1988

[30] Foreign Application Priority Data

Nov. 16, 1987 [JP] Japan ................................ 62-288730

[51] Int. Cl.$^4$ ............................................. H03K 17/04
[52] U.S. Cl. ..................................... 307/446; 307/443; 307/451; 307/570
[58] Field of Search ............... 307/443, 446, 451, 454, 307/362, 570, 296.1

[56] References Cited

U.S. PATENT DOCUMENTS

| | | | |
|---|---|---|---|
| 4,694,202 | 9/1987 | Iwamura et al. | 307/451 X |
| 4,730,132 | 3/1988 | Watanabe et al. | 307/446 |
| 4,733,110 | 3/1988 | Hara et al. | 307/446 |
| 4,806,797 | 2/1989 | Yamazaki | 307/570 X |
| 4,837,462 | 6/1989 | Watanabe et al. | 307/446 |
| 4,849,660 | 7/1989 | Hayashi et al. | 307/443 X |

*Primary Examiner*—David Hudspeth
*Attorney, Agent, or Firm*—Staas & Halsey

[57] ABSTRACT

A logic circuit improves a marginal voltage of a p-channel metal oxide semiconductor (MOS) transistor which is driven through a bipolar complementary metal oxide semiconductor (CMOS) gate. The logic circuit has a bipolar CMOS gate having a CMOS gate and output stage bipolar transistors for receiving an input signal through the CMOS gate, where the CMOS gate and the output stage bipolar transistors are driven by first and second power source voltages. The first power source voltage is higher than the second power source voltage and the output stage bipolar transistors output a signal as an output signal of the bipolar CMOS gate. A p-channel MOS transistor has a gate supplied with the output signal of the bipolar CMOS gate, a source supplied with a third power source voltage, and a drain from which an output signal of the logic circuit is outputted. The third power source voltage is a predetermined value lower than the first power source voltage and higher than the second power source voltage. As a result, the turning OFF of the p-channel MOS transistor is guaranteed due to the improved marginal voltage.

5 Claims, 4 Drawing Sheets

LOGIC CIRCUIT USING BIPOLAR COMPLEMENTARY METAL OXIDE SEMICONDUCTOR GATE AND SEMICONDUCTOR MEMORY DEVICE HAVING THE LOGIC CIRCUIT

BACKGROUND OF THE INVENTION

The present invention generally relates to logic circuits and semiconductor memory devices having such logic circuits, and more particularly to a logic circuit using a bipolar complementary metal oxide semiconductor (CMOS) gate and a semiconductor memory device using such a logic circuit in a column switch and the like thereof.

Conventionally, there is a random access memory (RAM) using bipolar CMOS gates which have bipolar transistors and MOS transistors within basic gates. In such a RAM, the bipolar transistor having a large driving capacity is used as an output stage transistor of the bipolar CMOS gate which is used in a driver and the like, while the MOS transistor is used for a switch.

FIG. 1A shows an example of output stage npn transistors Tr1 and Tr2. In FIG. 1A, $V_{CC}$ and $V_{EE}$ denote first and second power source voltages. Input signals to bases of the transistors Tr1 and Tr2 are obtained from a node $N_1$ between an emitter of the transistor Tr1 and a collector of the transistor Tr2. The first power source voltage $V_{CC}$ is applied to a collector of the transistor Tr1 and the second power source voltage $V_{EE}$ is applied to an emitter of the transistor Tr2, and these power source voltages $V_{CC}$ and $V_{EE}$ are similarly applied to MOS transistors constituting a CMOS inverter within the RAM. For example, $V_{CC}=0$ V and $V_{EE}=-5.2$ V.

An output voltage which is obtained from the node $N_1$ between the transistors Tr1 and Tr2 which operate with the power source voltages $V_{CC}$ and $V_{EE}$ has a high level on the order of $-0.5$ V which is approximately 0.5 V lower than the first power source voltage $V_{CC}$ and a low level on the order of $-4.7$ V which is approximately 0.5 V higher than the second power source voltage $V_{EE}$ as shown in FIG. 1B. In order to realize a high gate speed of an inverter and the like, it is desirable that a threshold voltage $V_{TH}$ of a p-channel MOS transistor below and approximately 0.6 V or less.

On the other hand, a CMOS inverter shown in FIG. 2 within the RAM is also applied with an input signal having a high level on the order of $-0.5$ V and a low level on the order of $-4.7$ V. In FIG. 2, the CMOS inverter has a p-channel MOS transistor Qa and an n-channel MOS transistor Qb and an output is obtained from a node $N_2$ between the MOS transistors Qa and Qb. When a high-level signal having a voltage of $-0.5$ V is applied to the CMOS inverter, the n-channel MOS transistor Qb is completely turned ON while the p-channel MOS transistor Qa is unlikely to be completely turned OFF because the first power source voltage $V_{CC}$ is 0 V and the p-channel MOS transistor Qa has no marginal voltage.

In addition, when the power source voltage gradually reaches a steady level, the rise time and fall time of the signal outputted from the bipolar CMOS gate become large. As a result, because the CMOS inverter supplied with the output signal of the bipolar CMOS gate is provided within a sense amplifier selection circuit, a column switch and the like, a first sense amplifier coupled to a data line and a second sense amplifier coupled to another data line may both be selected at one time when the selection should actually change from the first sense amplifier to the second sense amplifier. In other words, an erroneous operation occurs in the RAM.

Therefore, there is a demand for a logic circuit having a bipolar CMOS gate and a p-channel MOS transistor driven through the bipolar CMOS gate, wherein a marginal voltage of the p-channel MOS transistor is improved so as to guarantee a turning OFF of the p-channel MOS transistor.

SUMMARY OF THE INVENTION

Accordingly, it is a general object of the present invention to provide a novel and useful semiconductor memory device in which the problems described above are eliminated.

Another and more specific object of the present invention is to provide a logic circuit for improving a marginal voltage of a p-channel metal oxide semiconductor (MOS) transistor which is driven through a bipolar complementary metal oxide semiconductor (CMOS) gate, comprising a bipolar CMOS gate having a CMOS gate and output stage bipolar transistors for receiving an input signal through the CMOS gate, where the CMOS gate and the output stage bipolar transistors are driven by first and second power source voltages, the first power source voltage is higher than the second power source voltage and the output stage bipolar transistors output a signal as an output signal of the bipolar CMOS gate, and a p-channel MOS transistor having a gate supplied with the output signal of the bipolar COOS gate, a source supplied with a third power source voltage, and a drain from which an output signal of the logic circuit is outputted. The third power source voltage is a predetermined value lower than the first power source voltage and higher than the second power source voltage. According to the logic circuit of the present invention, it is possible to improve the marginal voltage of the p-channel MOS transistor and thus guarantee the turning OFF of the p-channel MOS transistor.

Still another object of the present invention is to provide a semiconductor memory device using bipolar complementary metal oxide semiconductor (CMOS) gates, comprising a first power source line for supplying a first power source voltage, a second power source line for supplying a second power source voltage which is lower than the first power source voltage, a plurality of word lines, a plurality of bit lines, a plurality of memory cells coupled at intersections of the word lines and the bit lines, a column switch coupled to each of the bit lines, where the column switch has a p-channel metal oxide semiconductor (MOS) transistor having one of a source and a drain thereof coupled to a corresponding one of the bit lines, a column driver for supplying a column selection signal to a gate of the p-channel MOS transistor of the column switch, where the column driver has bipolar transistors coupled in series between the first and second power source lines, a data line coupled to the column switch, where the data line is coupled to another of the source and the drain of the p-channel MOS transistor of the column switch, a sense amplifier coupled to the data line for detecting a read signal outputted on the data line, and a voltage generating circuit for generating a third power source voltage which is a predetermined value lower than the first power source voltage and higher than the third power source voltage. The data line is coupled to the voltage generating circuit so that the third power source voltage is supplied to the data line. According to the semiconductor memory device of the present invention, it is possible to improve a marginal voltage of the p-channel MOS transistor and thus prevent an erroneous operation within the semiconductor memory device such as a selection of two columns at one time.

Other objects and further features of the present invention will be apparent from the following detailed description when read in conjunction with the accompanying drawings.

DETAILED DESCRIPTION OF THE PREFERRED EMBODIMENT

The present invention provides a logic circuit which improves a marginal voltage of a p-channel MOS transistor which is driven through a bipolar CMOS gate. However, in order to facilitate the understanding of the superior effects obtainable by this logic circuit according to the present invention, a description will first be given of the application of the logic circuit to a semiconductor memory device.

Figure 1A:
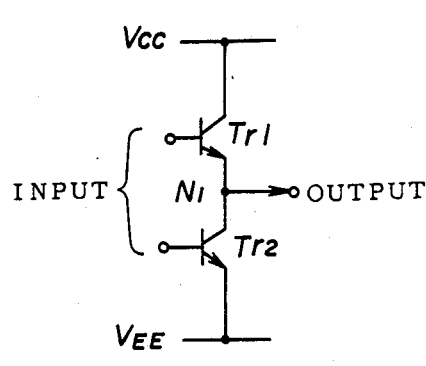
FIG. 1A is a circuit diagram of an example of output stage transistors.
Figure 1B:
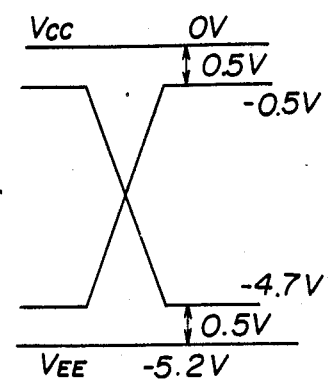
FIG. 1B is a graph of an output voltage of the output stage transistors shown in FIG. 1A with reference to first and second power source voltages.
Figure 2:
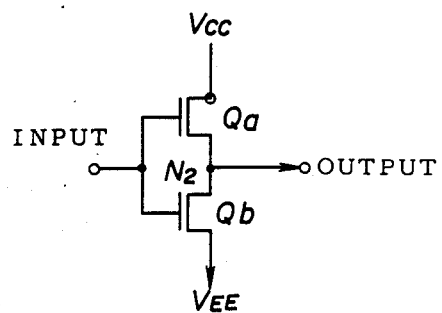
FIG. 2 is a circuit diagram of an example of a CMOS inverter.
Figure 3:
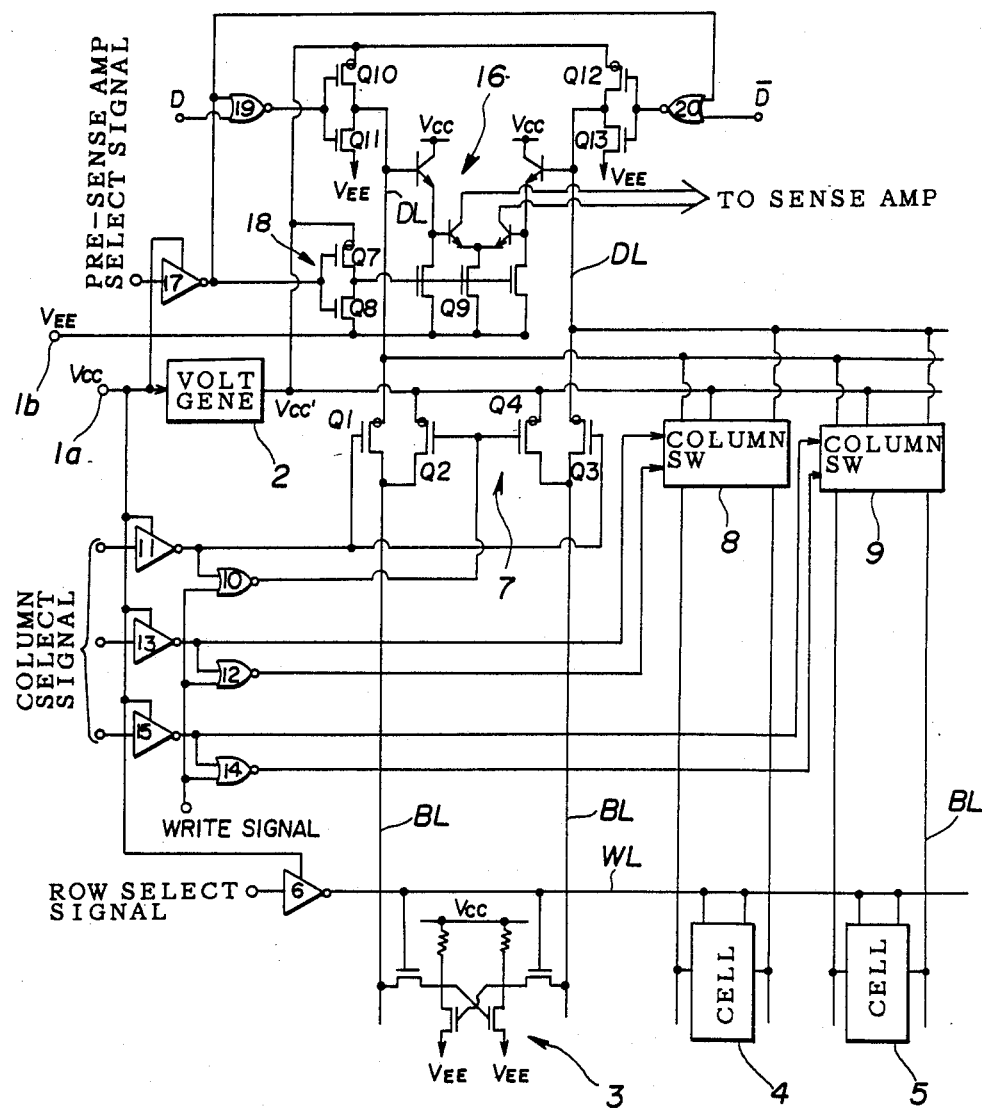
FIG. 3 is a circuit diagram of an embodiment of a semiconductor memory device according to the present invention.

FIG. 3 shows an embodiment of a semiconductor memory device according to the present invention. FIG. 3 shows a RAM using bipolar CMOS gates. A first power source voltage $V_{CC}$ which is generated from an external power source voltage generating circuit (not shown) is applied to a terminal $1a$, and the first power source voltage $V_{CC}$ is supplied to various parts of the RAM. A second power source voltage $V_{EE}$ which is generated from another external power source voltage generating circuit (not shown) is applied to a terminal $1b$ and is also supplied to various parts of the RAM. A voltage generating circuit 2 is supplied with the first power source voltage $V_{CC}$ and generates therefrom a third power source voltage $V_{CC'}$ which is greater than the first power source voltage $V_{CC}$ in the negative direction. Hence, when $V_{CC}=0$ V, $V_{CC'}=-0.8$ V. For example, the voltage generating circuit 2 may use a diode (not shown) to generate the third power source voltage $V_{CC'}$ which is 0.8 V greater than the first power source voltage $V_{CC}$ in the negative direction by a voltage drop of the diode.

Figure 4:
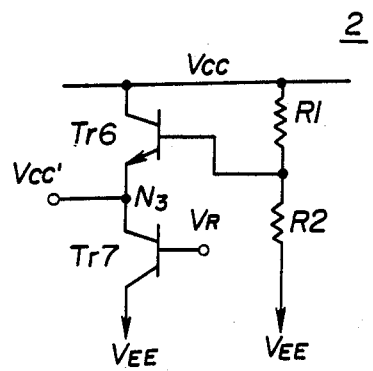
FIG. 4 is a circuit diagram of an embodiment of a voltage generating circuit of the semiconductor memory device.

FIG. 4 shows an embodiment of the voltage generating circuit 2. The voltage generating circuit 2 has npn transistors Tr6 and Tr7 which are connected in series between the first and second power source voltages $V_{CC}$ and $V_{EE}$, and resistors R1 and R2 which are connected in series between the first and second power source voltages $V_{CC}$ and $V_{EE}$. A connection point between the resistors R1 and R2 is connected to a base of the transistor Tr6. The third power source voltage $V_{CC'}$ is outputted from a node N3 between an emitter of the transistor Tr6 and a collector of the transistor Tr7. $V_R$ denotes a reference voltage.

The RAM has memory cells 3 through 5, a driver 6 for supplying a row selection signal to the memory cells 3 through 5, column switches 7 through 9, column drivers 11, 13 and 15 for supplying a column selection signal to the column switches 7 through 9, and drivers 10, 12 and 14 for supplying a write signal to the column switches 7 through 9. In addition, the RAM has a pre-sense amplifier 16, a bipolar CMOS gate 17, a sense amplifier selection circuit 18, and bipolar CMOS gates 19 and 20. The RAM has a plurality of word lines WL (only one shown), a plurality of bit lines BL and a plurality of data lines DL coupled to the bit lines BL through the column switches 7 through 9. The memory cells 3 through 5 are coupled at intersections of the word lines WL and bit lines BL.

Figure 5:
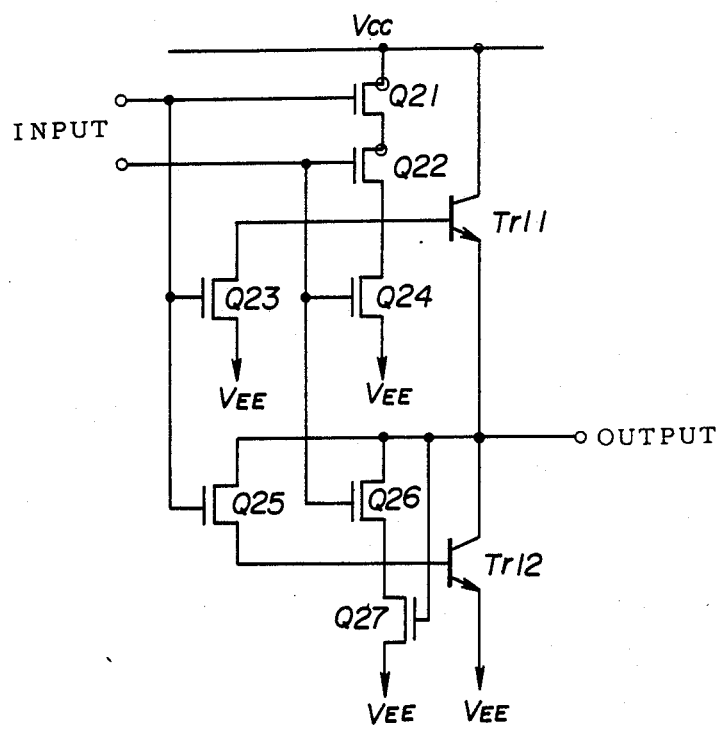
FIG. 5 is a circuit diagram of an embodiment of a NOR circuit of the semiconductor memory device.

In this embodiment, the drivers 10, 12 and 14, and the bipolar CMOS gates 19 and 20 are NOR gates having a construction shown in FIG. 5. The NOR gate has p-channel MOS transistors Q21 and Q22, n-channel MOS transistors Q23 through Q26, and npn transistors Tr11 and Tr12 which are coupled between the first and second power source voltages $V_{CC}$ and $V_{EE}$ as shown in FIG. 5.

Figure 6:
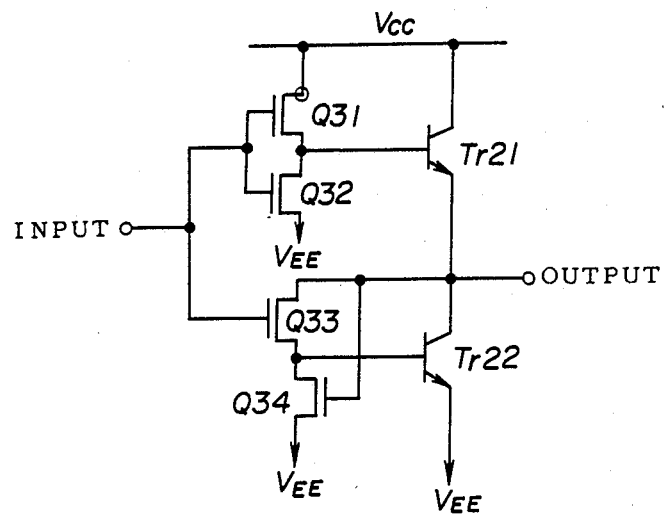
FIG. 6 is a circuit diagram of an embodiment of an inverter of the semiconductor memory device.

Furthermore, the drivers 6, 11, 13 and 15, and the bipolar CMOS gate 17 in this embodiment are inverters having a construction shown in FIG. 6. The inverter has a p-channel MOS transistor Q31, n-channel MOS transistors Q32 through Q34, and npn transistors Tr21 and Tr22 which are coupled between the first and second power source voltages $V_{CC}$ and $V_{EE}$ as shown in FIG. 6.

The column switches 7 through 9 respectively have the same construction, and only the construction of the column switch 7 is shown in FIG. 3. The column switch 7 has p-channel MOS transistors Q1, Q2, Q3 and Q4. On the other hand, in the sense amplifier selection circuit 18, a CMOS inverter made up of a p-channel MOS transistor Q7 and an n-channel MOS transistor Q8 is coupled to a gate of an n-channel MOS transistor Q9. This n-channel MOS transistor Q9 is connected to the pre-sense amplifier 16.

The first power source voltage $V_{CC}$ is supplied to the drivers 6, 11, 13 and 15. However, the third power source voltage $V_{CC'}$ is supplied to the p-channel MOS transistors Q2 and Q4 within the column switches 7 through 9, the p-channel MOS transistor Q7 within the sense amplifier selection circuit 18, and p-channel MOS transistors Q10 and Q12 within a circuit for outputting a write data D.

In a write mode of the RAM, the write data D is supplied to a CMOS inverter made up of the p-channel MOS transistor Q10 and an n-channel MOS transistor Q11 through the bipolar CMOS gate 19. On the other hand, a write data $\overline{D}$ having an inverted phase of the write data D is supplied to a CMOS inverter made up of the p-channel MOS transistor Q12 and an n-channel MOS transistor Q13 through the bipolar CMOS gate 20.

When a high-level write signal is outputted from the driver 10 and a low-level column selection signal is outputted from the column driver 11, the transistors Q1 and Q3 turn ON and the column switch 7 is in a selected state. In addition, because a pre-sense amplifier selection signal applied to the bipolar CMOS gate 17 constantly has a high level in the write mode, the transistor Q9 is constantly turned OFF and the pre-sense amplifier 16 is in a non-selected state.

Accordingly, the write data D and $\overline{D}$ are also supplied to the memory cell 3 and written therein through the transistors Q1 and Q3 of the column switch 7.

On the other hand, in a read mode, the pre-sense amplifier selection signal applied to the bipolar CMOS gate 17 has a low level and the transistor Q9 is turned ON, thereby putting the pre-sense amplifier 16 in a selected state. In addition, when a low-level write signal is outputted from the driver 10 and the low-level column selection signal is outputted from the column driver 11, the transistors Q1, Q2, Q3 and Q4 are turned ON and the column switch 7 is in the selected state. When the column switch 7 is selected by the row selection signal and the row selection signal is supplied to the memory cells 3 through 5, the data read from the memory cell 3 is supplied to the pre-sense amplifier 16 through the column switch 7 and is detected in the pre-sense amplifier 16.

In this read mode, the bipolar CMOS gates 19 and 20 and the drivers 13 and 15 output a high-level signal.

In the RAM which operates as described heretofore, the power source voltage applied to the sources of the p-channel MOS transistors Q1, Q2, Q3, Q4, Q7, Q10 and Q12 is the third power source voltage $V_{CC'}$ which is greater than the first power source voltage $V_{CC}$ in the negative direction. For this reason, when a gate input voltage of these p-channel MOS transistors changes from a low level to a high level, these p-channel MOS transistors are positively turned OFF within a short time compared to the p-channel MOS transistors of the conventional semiconductor memory device.

It is also conceivable to apply the third power source voltage $V_{CC'}$ to sources of p-channel MOS transistors other than the p-channel MOS transistors Q1, Q2, Q3, Q4, Q7, Q10 and Q12. However, in this embodiment, the third power source voltage $V_{CC'}$ is applied to the sources of the p-channel MOS transistors Q1, Q2, Q3, Q4, Q7, Q10 and Q12 because a change in the output level of these p-channel MOS transistors causes an erroneous operation of the column switches 7 through 9 and the pre-sense amplifier 16 such as an erroneous selection of two sense amplifier at one time. On the other hand, a change in the output level of the p-channel MOS transistors other than the p-channel MOS transistors Q1, Q2, Q3, Q4, Q7, Q10 and Q12 does not cause such an erroneous operation, and it is thus unnecessary to supply the third power source voltage $V_{CC'}$ in place of the first power source voltage $V_{CC}$ to these other p-channel MOS transistors. In addition, if the third power source voltage $V_{CC'}$ were to be supplied to all of the p-channel MOS transistors of the RAM, it becomes necessary to use as the voltage generating circuit 2 a circuit which has a large driving capacity and inevitably the scale and construction of the circuit respectively become large and complex.

The embodiment of the semiconductor memory device according to the present invention described heretofore uses a logic circuit which improves the marginal voltage of a p-channel MOS transistor which is driven through a bipolar CMOS gate. However, the application of such a logic circuit is not limited to the semiconductor memory device.

Figure 7:
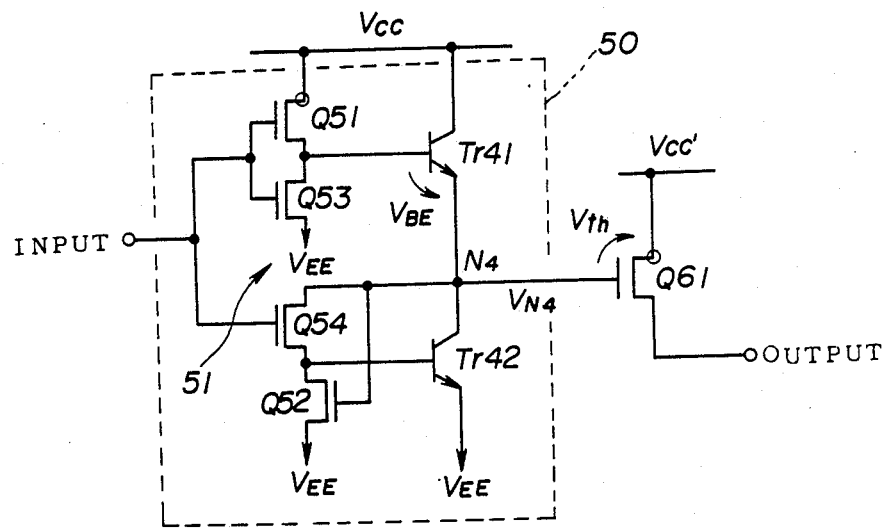
FIG. 7 is a circuit diagram of an embodiment of a logic circuit according to the present invention for improving a marginal voltage of a p-channel MOS transistor which is driven through a bipolar CMOS gate.

FIG. 7 shows an embodiment of a logic circuit according to the present invention for improving a marginal voltage of a p-channel MOS transistor which is driven through a bipolar CMOS gate. In FIG. 7, a bipolar CMOS gate 50 is connected to a p-channel MOS transistor Q61. The bipolar CMOS gate 50 has a CMOS gate 51 made up of a p-channel MOS transistor Q51 and n-channel MOS transistors Q52, Q53 and Q54, and output stage npn transistors Tr41 and Tr42 which are connected as shown.

When the transistor Tr41 is turned ON, a voltage $V_{N4}$ at a node $N_4$ becomes $V_{CC} - V_{BE}$, where $V_{BE}$ denotes a base-emitter voltage of the transistor Tr41. In this case, it is necessary to turn the p-channel MOS transistor Q61 OFF by the voltage $V_{N4}$, and this voltage $V_{N4}$ must be greater than a threshold voltage $V_{th}$ of the p-channel MOS transistor Q61. If the power source voltage applied to a source of the p-channel MOS transistor Q61 were the first power source voltage $V_{CC}$ which is 0 V, there is no marginal voltage and the turning OFF of the p-channel MOS transistor Q61 cannot be guaranteed. However, in this embodiment, the power source voltage applied to the source of the p-channel MOS transistor Q61 is the third power source voltage $V_{CC'}$ which is 0.8 V lower than the first power source voltage $V_{CC}$ in the negative direction. For this reason, the threshold voltage $V_{th}$ is kept to a low voltage on the order of 0.6 V or less, and the turning OFF of the p-channel MOS transistor Q61 by the voltage $V_{N4}$ is guaranteed due to the improved marginal voltage.

Further, the present invention is not limited to these embodiments, but various variations and modifications may be made without departing from the scope of the present invention.

What is claimed is:

1. A logic circuit for improving a marginal voltage of a p-channel metal oxide semiconductor (MOS) transistor which is driven through a bipolar complementary metal oxide semiconductor (CMOS) gate driven by first and second power source voltages, said logic circuit coupled to a third power source voltage and comprising:

a bipolar CMOS gate including a CMOS gate and output stage bipolar transistors for receiving an input signal through said CMOS gate, said CMOS gate and said output stage bipolar transistors being driven by the first and second power source voltages, the first power source voltage being higher than the second power source voltage, said output stage transistors outputting a signal as an output signal of said bipolar CMOS gate; and a p-channel MOS transistor having a gate coupled to said output stage transistor, and supplied with the output signal of said bipolar CMOS gate, said p-channel MOS transistor having a source supplied with the third power source voltage, and a drain for providing an output signal of said logic circuit, the third power source voltage being a predetermined value lower than the first power source voltage and higher than the second power source voltage.

2. A logic circuit as claimed in claim 1, wherein said output stage bipolar transistors are constituted by a pair of npn transistors coupled in series between the first and second power source voltages and output the output signal of said bipolar CMOS gate from a connection point between said pair of npn transistors, the first power source voltage being substantially 0 V, the second power source voltage being approximately −5.2 V, the third power source voltage being approximately −0.8 V.

3. A logic circuit coupled to first and second power source voltages, comprising:
  a bipolar CMOS gate, including:
    a CMOS gate for receiving an input signal; and
    output stage bipolar transistors, coupled to said CMOS gate, for receiving the input signal through said CMOS gate, said CMOS gate and said output stage bipolar transistors being driven by the first and second power source voltages, the first power source voltage being higher than the second power source voltage, said output stage bipolar transistors providing a first output signal;
  means for providing a third power source voltage of a predetermined value lower than the first power source voltage and higher than the second power source voltage; and
  a p-channel MOS transistor having a gate coupled to said output stage bipolar transistors, for receiving the first output signal provided by said output stage bipolar transistors, said p-channel MOS transistor having a source coupled to said means for providing the third power source voltage, and having a drain for providing a second output signal of said logic circuit.

4. A logic circuit as claimed in claim 3, wherein said output stage bipolar transistors are formed by a pair of npn transistors coupled in series between the first and second power source voltages, the first output signal being provided from a connection point between said pair of npn transistors.

5. A logic circuit as claimed in claim 4, wherein the first power source voltage is substantially 0 volts, the second power source voltage is substantially −5.2 volts, and the third power source voltage is substantially −0.8 volts.

* * * * *